United States Patent [19]

Angelucci, Sr. et al.

[11] 4,380,042
[45] Apr. 12, 1983

[54] PRINTED CIRCUIT LEAD CARRIER TAPE

[76] Inventors: Thomas L. Angelucci, Sr., 89 Charlan Cir., Cherry Hill, N.J. 08003; Joseph L. Angelucci, 1948 Little Dr., Deptford, N.J. 08096

[21] Appl. No.: 235,341

[22] Filed: Feb. 23, 1981

[51] Int. Cl.³ .................. H01L 23/48; H01L 29/32
[52] U.S. Cl. .................. 361/421; 29/838; 29/839; 174/52 FP; 174/52 PE; 357/70; 361/408
[58] Field of Search .......... 361/421, 398, 403, 408; 174/52 PE, 52 FP, 117 PC, 68.5; 29/835, 838, 839, 840, 853; 357/69, 70

[56] References Cited

U.S. PATENT DOCUMENTS

| | | | |
|---|---|---|---|
| 3,440,027 | 4/1969 | Hugle | 29/193.5 |
| 3,544,857 | 12/1970 | Byrne et al. | 317/234 |
| 3,611,061 | 10/1971 | Segerson | 174/52 PE X |
| 3,689,991 | 9/1972 | Aird | 29/577 |
| 4,214,364 | 7/1980 | St. Louis et al. | 174/52 PE X |
| 4,234,666 | 11/1980 | Gursky | 361/421 X |
| 4,289,922 | 9/1981 | Devlin | 361/421 X |
| 4,312,926 | 1/1982 | Burns | 357/69 |

FOREIGN PATENT DOCUMENTS 53-139976 12/1978 Japan .

Primary Examiner—R. R. Kucia

[57] ABSTRACT

A printed circuit lead frame is provided as a carrier for integrated circuits. The conventional frame comprises a foil pattern that is provided with a plurality of fragile delicate lead fingers which are often bent and displaced laterally or vertically before they can be connected to the terminal pads of a semiconductor chip. The present invention provides a removable stabilizing connecting frame which is made from the same conductive foil as the lead fingers and is provided with tear links which innerconnect the removable frame and each of the lead fingers so that the stabilizing frame may be removed after the lead fingers are bonded to the terminal pads of the semiconductor chip.

10 Claims, 5 Drawing Figures

PRINTED CIRCUIT LEAD CARRIER TAPE

BACKGROUND OF THE INVENTION

1. Field of the Invention

This invention relates to flexible conductive foil printed circuit patterns which are commonly called lead frames and may be laminated to flexible dielectric strip carriers. More particularly, this invention is concerned with flexible sprocketed lead frame tapes having a plurality of printed circuit patterns arranged sequentially thereon which are provided with a plurality of fragile delicate lead fingers which are referred to as inner leads in this industry and are adapted to be connected to terminal pads on a semiconductor device.

The novel improved printed circuit lead carrier tape of the present invention is adapted to be supplied in reel form to be used on bonding machines and assembly machines for automatic and semiautomatic production of electronic modules or devices.

2. Description of the Prior Art

Very early semiconductor chips were connected to the post of metal headers which constituted the lead out terminals for the semiconductor device by means of fine wire consisting of gold and aluminum. Originally such wire bonded connections were made manually employing special wire bonding machines. Due to labor costs these manual operations have been semiautomated and fully automated at the present time.

Numerous attempts have been made to fabricate the equivalent of a fine wire by making a printed circuit pattern on a rigid substrate and providing the semiconductor chip with bumps at the terminals or pads. The chip was then placed face down on the pattern in proper registration and all of the bumps connected to the pattern at the same time. This technique or method has been commonly referred to as flip chip bonding.

The printed circuit or foil pattern has also been placed on a flexible dielectric carrier or substrate in a form which provides the equivalent of wire bonded leads in the printed circuit pattern. Byrne et al. U.S. Pat. NO. 3,544,857 recognized that the printed circuit pattern should be stabilized and provided a throw away carrier which was peeled off after the pattern was bonded to the semiconductor chip. The fingers or leads in this device required that the bonding take place by applying the bonding force through the compliant peel away carrier. The outer ends of the leads of the Byrne et al device were connected to printed circuit patterns which constituted a portion of the outer leads.

Hugle U.S. Pat. No. 3,440,027 mounted a foil pattern on an indexed insulative carrier substrate and provided printed circuit leads which were the equivalent of wire interconnections which could be separated from the carrier after the leads were bonded to a chip in a manner similar to that anticipated by Byrne et al.

Aird U.S. Pat. No. 3,689,991 refined the Hugle and Byrne et al. techniques employing foil patterns and carrier dielectrics to provide a plurality of true cantilevered beams which extended out over a device aperture to provide inner lead fingers. The dielectric carrier tape also became a support for the outer end of the printed circuit pattern leads which provided outer cantilevered beam leads. This structure permitted the free ends of the conductive foil pattern to be bonded directly to terminal pads of the semiconductor chip and then to the lead out terminals on a substrate as a substitute for wires.

The semiconductor industry has progressed by providing higher density integrated circuit devices at lower cost. Progress is directed to increasing the number of devices on a given area and to increasing the speed of operation of the devices on the integrated circuit chip. By shortening the distances between the discrete elements on the integrated circuit, the time of propagation is decreased. Further, the intercapacitive and interconductive values for the discrete elements are reduced as the elements are made smaller which permits increased frequency of operation of the device.

As integrated circuit devices are made smaller, the terminal pads or lead out pads on the integrated circuits are also being made smaller. Due to the face that it is difficult or near impossible to wire bond small wires on a pad which is less than four mils in diameter or rectangular shape, there is a limit to the ability to automatically wire bond high density very large integrated circuit devices.

In the present state of the art, a 1.3 mil gold wire can be successfully bonded in an automatic wire bonder to a pad which has a rectangular size of approximately four mils separated on four mil centers. As these pads and separation distances are made smaller, the effectiveness of wire bonding is appreciably dimenished.

It is possible to make flexible lead carrier tape having a photo lithographically produced printed circuit pattern of conductive flexible foil thereon which is very accurate. For example, the cantilevered fingers may be produced which are only two mils wide and are capable of being bonded to two mil rectangular or circular terminal pads on four mil centers. Such accurate leads may be connected to the terminal pads of a semiconductor device using my Tape Automatic Bonding (TAB) machine which is described in my U.S. Pat. No. 4,050,618. It has been shown that as many as 240 such cantilevered leads can be bonded simultaneously to a semiconductor chip employing accurately controlled conditions. When TAB bonding 240 or more two mil leads to an integrated circuit device it was found that handling the fragile delicate fingers required special handling techniques to avoid bending any one of the leads which would render the circuit pattern inoperative for commercial bonding. Commercial lead carrier tapes are presently made with four mil wide fingers and as many as fifty percent of the tape sites or circuit patterns which reach the bonding station have at least one or more of the fragile delicate fingers bent which requires rejection rework and/or manual straightening of the fingers. The alternatives to straightening the fingers before reaching the bonding station is to reject the partially completed device and/or manually repairing the circuit pattern an a repair station. The problem of bent cantilevered lead fingers has existed as long as this technique has been used in the industry. As the number of cantilevered finger leads increases on each circuit pattern tape site and the width of the lead finger decreases toward the two mil or less dimension, the rate of damaged tape sites reaching the bonding station will increase exponentially. The problem has long been recognized as reducing yields in assembling devices. The aforementioned Aird Patent attempted to supply a dielectric carrier support intermediate the ends of the leads. Other manufacturers have attempted to screen on or fabricate nonremovable dielectric rings, intermediate the ends of the cantilever beams to effectively shorten the length of the cantilevered beams and increase stability of the lead or finger. However, these attempts to stabilize the fragile delicate cantilevered lead fingers have proven unsuccessful and the problem of such leads being bent in the vertical or lateral direction remains unsolved.

It would be desirable to provide a conductive foil printed circuit pattern on a flexible conductive tape or a flexible foil printed circuit pattern on a dielectric carrier tape with cantilevered lead fingers of approximately two mils width so as to accomodate the presently anticipated highest density VLSIC chips being manufactured in the laboratories today. Further, it would be desirable to increase the yields of lead carrier tape manufacturers and the yields on TAB bonding machines when employing high density fragile delicate lead fingers on the circuit patterns being attached to the integrated circuit chips.

SUMMARY OF THE INVENTION

It is a primary object of the present invention to provide a method and means to commercially produce lead carrier tapes having printed circuit tape sites thereon with fragile cantilevered lead fingers and to produce higher hields at the bonding station without a cost increase in the manufacture of the lead carrier tapes.

Another primary object of the present invention is to provide means for commercially producing lead carrier tapes having printed circuit tape sites with smaller inner lead fingers located on closer arranged centers so as to provide a greater number of cantilevered lead fingers over a device aperture while increasing the number of perfect printed circuit tape sites that reach the bonding station.

Another primary object of the present invention is to provide a lead carrier tape having printed circuit tape sites which produce greater yields of acceptable leads bonded to the integrated circuit device.

It is another object of the present invention to provide means for conducting a bond pull strength test after the delicate fragile cantilevered lead fingers are bonded to the terminal pads of an integrated circuit device.

It is another object of the present invention to provide means for automatically and sequentially conducting bond pull strength test.

According to these and other objects of the present invention to be explained in greater detail hereinafter there is provided a printed circuit lead frame site which is made by conventional photo lithography means. The novel flexible conductive foil printed circuit tape site comprises a foil pattern that is provided with a plurality of delicate fragile lead fingers. The lead fingers are adapted to be connected to the terminal pads of a semiconductor chip. The end portions of the cantilevered lead fingers are connected to a stabilizing connecting frame which is removable from the lead fingers by means of a tear link interconnecting the lead frame and the end portions of the cantilevered beam. The novel removable frame and tear links are preferably manufactured of the same conductive foil from which the printed circuit pattern is made, thus providing a substantial improvement without an increase in cost.

DESCRIPTION OF THE PREFERRED EMBODIMENT

Figure 1:
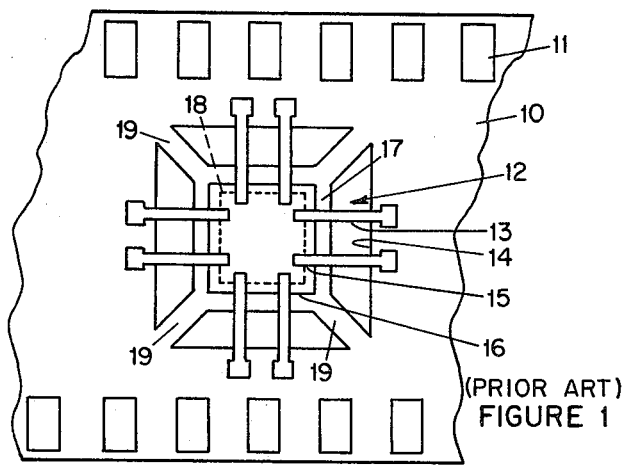
FIG. 1 is an enlarged plan view of a typical prior art lead carrier tape pattern.

Refer to FIG. 1 showing a typical prior art lead carrier tape. The base or dielectric carrier 10 is preferably made from a very thin plastic polymer base such as Kapton and is provided with indexing sprocket holes 11. The flexible dielectric carrier 10 is provided with a foil pattern which has been simplified for purposes of this description and illustration. The printed circuit pattern which is preferably etched from a foil laminated on the dielectric carrier, is represented by two conductive leads 12. The conductive lead 12 comprises an outer end or outer lead portion 13 which extends over the lead aperture 14. At the opposite end of the conductive lead 12 there is an inner lead 15 which extends as a cantilevered beam or finger over the device aperture 16. Thus, it will be understood that the two leads 12 are supported on the dielectric carrier 10 at the lead support or bridge portion 17. The inner lead 15 is shown extending over the edge portion of a semiconductor device 18 shown in phantom lines. It will be understood that the inner lead may be bonded to the terminal pads (not shown) on semiconductor device 18 by a bonding machine known in this art as a gang bonder. After the inner leads 15 are connected to the device 18, the outer end or outer leads 13 are cut and folded downward at the outer edge of the lead aperture 14. At a later station or step, the device with the bent leads 12 are cut from the dielectric carrier 10 by severing the bridges 19 thus providing a device with attached leads which may later be attached to a substrate (not shown). It will be noted that the inner leads 15 comprise short cantilever beams which are free to be bent or displaced before being attached to the device 18. Further, it will be noted that the lead support 17 and bridge 19 are permanently attached to the conductive leads 12 and will remain as a segment of the dielectric polymer carrier 10 when finally encapsulated into the sealed module. It is well known that having polymers which produce outgas inside of the module is a disadvantage which has been recognized but not rectified.

Figure 2:
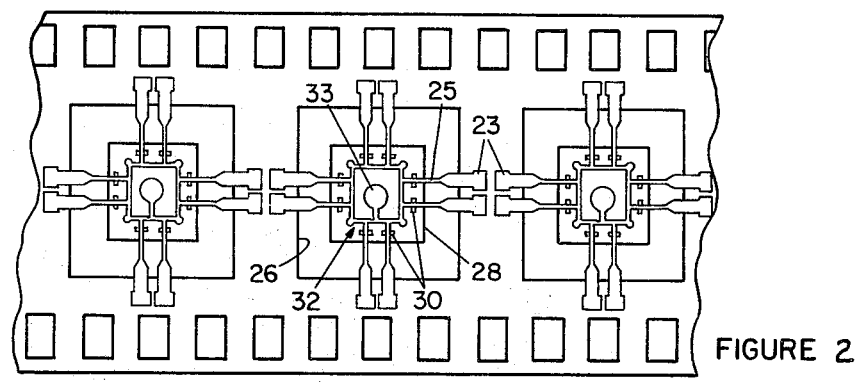
FIG. 2 is a plan view showing a portion of a continuous lead carrier tape having printed circuit patterns thereon.

FIG. 2 is a plan view showing a portion of a continuous lead carrier tape having a plurality of improved patterns thereon. It will be understood that the patterns shown in FIG. 2 and FIG. 3 to be described hereinafter have been simplified for purposes of illustrating and explaining this invention. Such patterns may have as many as 240 or more inner lead fingers for attachment to a very large scale integrated circuit device.

Figure 3:
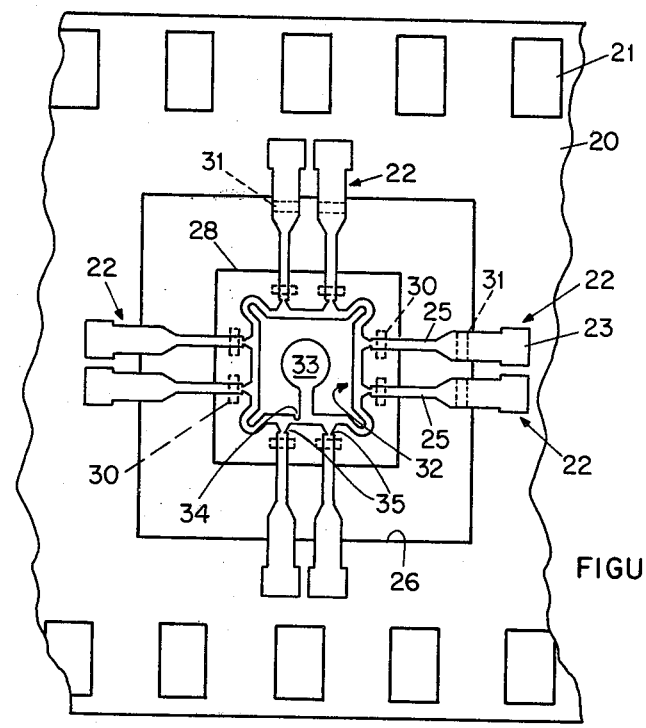
FIG. 3 is an enlarged plan view of a simplified printed circuit tape site of the type shown in FIG. 1 illustrating the present invention.

Refer now to FIG. 3 showing in enlarged detail a plan view of the present invention. The dielectric carrier 20 is of the same type as the previously described dielectric carrier 10 having sprocket holes 21 therein. The novel shaped conductive leads 22 extend from the dielectric carrier 20 completely unsupported and provide an outerlead portion 23 which continues and is formed into the inner lead portion 25. It will be noted that the complete inner and outer lead portion extend out over and into the device aperture 26. The inner lead 25 is shown in registration over a semiconductor device 28 shown in phantom lines having a plurality of bonding pads 30 thereon. It will be understood that the inner leads 25 are simultaneously bonded to the bonding pads 30 by a gang bonding device.

After the inner leads 25 are connected to the bonding pads 30 the preferred step in the use of the novel structure is to remove the stabilizing connecting frame 32 from the pattern by pulling on pull tab 33. Preferably stabilizing frame 32 is provided with a frame tear link 34 adjacent the pull tab 33 so that an initial pull will severe frame tear link 34 first. As a continuous pull force is applied to the pull tab 33, the lead tear links 35 are sequentially severed from the ends of the inner leads 25 by exerting a predetermined force thereon. It will be understood that the cross-sectional area of the lead tear links 35 may be so constructed that a precise predetermined pull force will be applied to these leads and will test the strength of the bond between the inner lead 25 and the bonding pad 30 on the semiconductor device 28.

After the pull tab 33 and stabilizing frame 32 are removed from the printed circuit pattern an electrical test of the semiconductor device 28 may be conducted. After any test is conducted the good devices may be separated from the bad devices by means well known. After the good devices are sorted the outer portion of the outer lead 23 is severed adjacent the device aperture 26 so that the lead to substrate bonding area is now free as the end of a cantilevered beam to be attached to a bonding terminal on a substrate at the area 31 for final asssembly of the semiconductor device 28.

Figure 4:
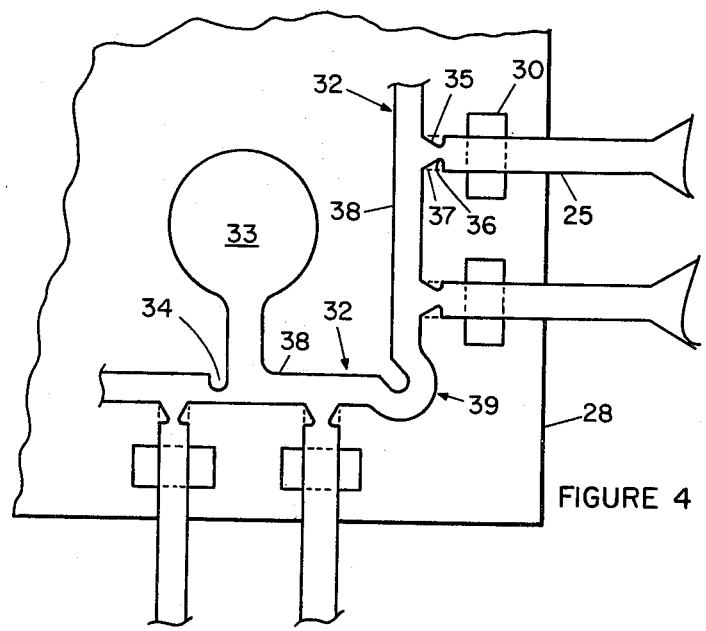
FIG. 4 is an enlarged partial plan view of the printed circuit tape site of FIG. 1.

It will be noted that no lead aperture is provided in the novel structure. It will also noted that no lead support of dielectric polymer is attached to the finished assembly. It will also be noted that no polymer bridge element is attached to the novel structure comprising a semiconductor device with a plurality of conductive leads attached thereto for assembly into a module. Thus, the undesirable effect of having polymers which produce outgas inside of the encapsulated module are avoided. Refer now to FIG. 4 showing in enlarged detail the portion of the device 28 which includes the bonding pads 30 and the inner leads 25. The inner leads 25 are shown connected to the stabilizing frame 32 by means of lead tear links 35. A preferred shape for lead tear link 35 is a tapered shape which terminates adjacent the end of the inner lead 25 in a tear point 36. It will be understood that the usual bonding pull force is such that a reduced cross section of the inner lead 25 will be preferred. However, the inner lead 25 may continue as a lead tear link 37 shown in phantom lines without a reduced cross section because the force required to break the inner lead 37 is less than that required to severe the bond at bonding pad 30.

The preferred method for producing the tear point or tear link 35 is by chemically milling at the time the printed circuit pattern is made from the foil. Thus, it will be understood that the stabilizing frame 32 may be made from the same foil of the printed circuit pattern and that no additional cost is incurred in producing this improved structure. Even though the invention has been illustrated with a reduced cross section tear link 36 it will be understood that the link 37 or similar link may be produced by scoring the portion 37 with a knife or forming tool. Further, in the present state of the art a laser beam may be employed to reduce the cross section of the link 37 by scoring or even severing if it is possible to do so without harming the semiconductor device 28.

Refer now to FIGS. 3 and 4 showing the novel stabilizing frame 32. When the inner leads 25 are simultaneously gang bonded to the bonding pads 30 the frame 32 and inner leads 25 are usually depressed out of the plane of the copper foil pattern to reach the bonding pad 30 at a slightly lower level. When this gang bonding step occurs the leads are deflected so that the frame 32 is stretched very slightly. To assure that the sides 38 of the frame 32 remain straight so as to maintain the proper position of the inner leads 25 there is provided an expansion joint 39 at each of the corners of the frame 32. It will be understood that the frame 32 may only be moved through a distance of three to five mils excursion and that the novel expansion joints 39 will maintain the sides of the frame 38 perfectly normal to the leads 25.

The frame tear link 34 is shown having a cross section area approximately equal to the tear point 36 of the lead tear link 35. Thus, when the frame 32 is pressed out of the plane of the printed circuit foil pattern the frame tear link is sufficiently strong to maintain the frame side 38 straight without severing. Refer back to FIG. 1 and compare the free ends of the cantilevered lead finger 15 to the cantilevered inner lead 25. When the cantilevered inner leads 15 are depressed by the force of the gang bonding tool, any weakness or discontinuity in the inner lead 15 will cause the finger lead 15 to deflect laterally under the pressure of the gang bonding tool (not shown). If the lateral deflection of the inner lead 15 is sufficient during its excursion to engage the bonding pad it will not correctly engage the bonding pad and may result in an improper or weakened bonding connection. Compare the inner lead 25 which is effectively attached to the stabilizing frame 32 when the gang bonding tool (not shown) engages the inner leads 25 with the bonding pads 30. Even if there is a discontinuity in the inner lead 25 it is stabilized by the frame sides 38 of the frame 32 so that the lead maintains its position normal to the frame sides 38 and is engaged in perfect registration on the bonding pads 30.

Figure 5:
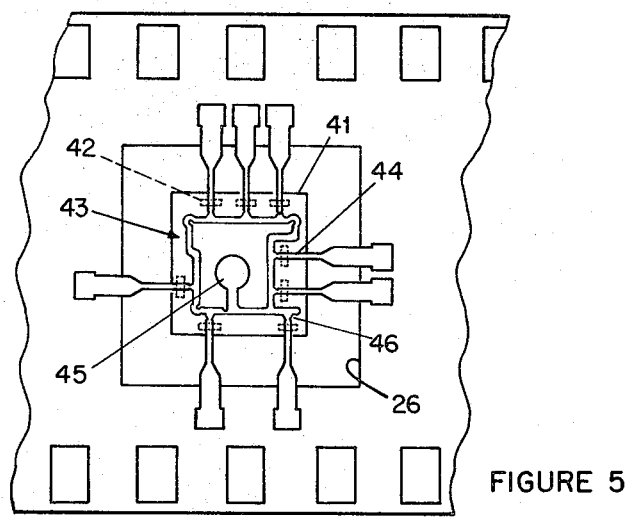
FIG. 5 is a plan view of another printed circuit tape site illustrating the present invention with a pad arrangement on the semiconductor device other than a device having only peripheral terminal bonding pads.

Refer now to FIG. 5 showing a plan view of a modified printed circuit tape site. In the event that a semiconductor device 41 is provided with bonding pads 42 which do not occur regularly at the outer perimeter of the device, the present invention may be employed. Even though the novel stabilizing frame 43 is not in the preferred rectangular shape it may be designed to extend so that its rectangular sides provide stability normal to the inner leads 44. In the preferred application of the novel frame 43 it will extend inside of the outer ends of the inner leads 44 so that when the pull tab 45 is employed to remove the frame 43 the lead tear links 46 will be severed from the ends of the inner leads 44. Having explained a preferred embodiment continuous flexible lead carrier tape employing a novel removable lead stabilizing connecting frame and tear links, it will be understood that the novel stabilizing frame 32 may be applied to any type pattern of inner lead fingers. The novel stabilizing frame 32 enables the printed circuit which is carried by the dielectric carrier to be provided with conductive leads which are longer in their cantilevered extension than were heretofore possible. In fact, the cantilevered portion of the present invention includes both the inner lead 25 and the outer lead 23. While the present invention is explained in conjunction with a dielectric carrier 20 it will be understood that a foil printed circuit pattern of the type shown in FIG. 3 may be made in a continuous piece of conductive foil without the dielectric carrier. A typical application of such a printed circuit pattern would be for a single layer foil pattern to be connected to a semiconductor device without the aforementioned electrical test.

An additional benefit in employing a continuous frame like the frames 32 and 43 occurs during gang bonding. When the heated tool is brought into contact with the inner leads 25 and the bonding pads 30 the heat from the bonding tool is transmitted through the stabilizing frame and thus insures a more uniform distribution of heat from the bonding tool during the bonding operation which is performed over a very short cycle.

Yet another benefit is derived from the present invention which is not directly related to the shape of the pattern. In the preferred method of manufacturing the foil pattern, a cold rolled foil layer is laminated by adhesive bonding to the dielectric carrier tape, 11, 20. Rolled copper foil which is 70 to 100 percent full hard is less likely to be bent and be damaged in handling. Further, free end cantilevered foil fingers 15 as employed in the prior art are so small and delicate that they must be made of hard copper to prevent bending during manufacture and assembly. Even then hard copper foil fingers 15 are easily bent. When the foil is made too soft, usually below 70 percent, disturbances in the air are sufficient to bend the fingers. Liquid mist or drops of process chemicals will bend soft copper fingers. The stabilizing frame not only permits the cantilevered fingers to be made of softer copper without handling and process damage, but now permits the lead pattern to be made of very hard copper for purposes of handling and processing. Hard rolled copper foil fingers do not deform as easily as soft copper foil fingers and thus do not make as good a bond to the bonding pads 30. Heretofore, the manufacturer had to choose between good bonds using soft copper and hard copper to preserve adequate yields. Now the manufacturer has two entirely different choices. The copper foil pattern may be made of softer copper foil than heretofore possible without bending the finger-like leads when the inner lead fingers are relatively large. When large scale integrated circuit patterns are manufactured, it is preferred to make the pattern of hard rolled copper foil which remains hard until it reaches the bonding station where the semiconductor device is to be attached. Prior to gang bonding the inner leads 25 to the bonding pads 30, the ends of inner leads 25 are annealed to produce a soft copper in the preferred bonding range of hardness. This may be performed in a hot gas annealing station or even by use of a heated tool or induction heating which could not be performed on the free end cantilevered leads 15 of the prior art without deforming them.

We claim:

1. A continuous flexible lead carrier tape having a plurality of sequential lead patterns thereon, the improvement comprising:
    a flexible dielectric carrier based tape,
    a flexible foil conductive pattern on said base tape,
    an aperture in said tape adapted to receive a semiconductor device and to be connected to said foil pattern,
    said foil pattern having a plurality of finger-shaped leads converging towards said aperture and extending as cantilevered leads in a common plane from said base tape over the edge portion of said aperture in said base tape to provide a plurality of inner electrical leads adapted to be connected to terminals on said semiconductor device,
    a removable lead stabilizing connecting frame,
    said connecting frame being formed from said foil conductive pattern,
    said frame being located juxtaposed the end portion of said cantilevered leads,
    lead tear links forming a conductive foil connection between said frame and said end portions of said cantilevered leads,
    a frame tear link in said stabilizing connecting frame for initially severing one side of said frame, and
    said stabilizing frame being adapted to be removed from said cantilevered leads by first severing said frame tear link after said cantilevered leads are connected to said terminals on said semiconductor device and subsequentially severing each lead tear link one after the other so that a uniform severing force is applied to each lead tear link.

2. A flexible lead carrier tape as set forth in claim 1 wherein said tear links comprise an extension of said frame of said conductive foil pattern which is weakened by having its cross sectional area made smaller in cross section than said frame to provide a preferred point of separation of said frame from said cantilevered leads.

3. A flexible lead carrier tape as set forth in claim 2 wherein said lead tear links are made smaller in cross sectional area than the end portion of said cantilevered beams to provide a predetermined uniform tensile pull strength bond test at the time of separation from said cantilevered beams.

4. A flexible lead carrier tape as set forth in claim 3 wherein there is further provided a pull tab connected to said removable frame and wherein said pull tab is located adjacent said frame tear link in said removable frame.

5. A flexible lead carrier tape as set forth in claim 1 wherein said tear links are reduced in cross sectional area after said semiconductor device is bonded to said cantilevered fingers.

6. A flexible lead carrier tape as set forth in claim 1 wherein said removable lead stabilizing frame further includes a plurality of expansion joints.

7. A flexible lead carrier tape as set forth in claim 1 wherein said finger-shaped leads comprise annealed soft copper for bonding to said semiconductor device.

8. A continuous flexible printed circuit tape having plurality of sequential lead patterns thereon, the improvement comprising:
    a flexible foil tape,
    a pattern of conductive flexible leads formed in said foil tape,
    said foil pattern having a plurality of finger-shaped leads converging to a mutual center area and extending as cantilevered leads in a common plane from said foil tape to provide a plurality of inner electrical leads adapted to be connected to terminal pads on a semiconductor device,
    a removable lead stabilizing connecting frame,
    said frame being formed from said foil conductive pattern,
    said frame being located juxtaposed the end portion of said cantilevered leads,
    lead tear links forming a conductive foil connection between said frame and the end portions of each of said cantilevered leads, a frame tear link in said frame for initially opening one side of said frame when said frame tear link is severed, and said frame being adapted to be removed from said cantilevered leads by first severing said frame tear link after said cantilevered leads are connected to said semiconductor device, and sequentially severing each lead tear link one after the other so as to apply a uniform pull force on one lead tear link at a time.

9. A flexible lead printed circuit tape as set forth in claim 8 which further includes, a plurality of expansion joints formed as a part of said removable lead stabilizing frame.

10. A semiconductor chip having a plurality of inner leads bonded thereto to provide a semiconductor device, made by steps of:

providing a semiconductor chip of the type having a plurality of bonding pad terminals thereon, providing a foil tape lead pattern having a plurality of cantilevered lead fingers thereon adapted to be connected to said bonding pad terminals, providing a plurality of conductive foil lead tear links connected to each of said cantilevered fingers at the end portion thereof formed as an extension of said cantilevered leads, forming a conductive foil removable lead stabilizing frame connected to said lead tear links as an extension of said cantilevered leads and said tear links, providing a frame tear link in said lead stabilizing frame, bonding said cantilevered lead fingers to said terminal pads on said semiconductor chip, breaking said frame tear link and opening said frame, and removing said removable stabilizing frame by sequentially severing said lead tear links, to provide a semiconductor device having inner leads connected to said semiconductor chip.

* * * * *